United States Patent [19]

Hong et al.

[11] Patent Number: 4,920,066
[45] Date of Patent: Apr. 24, 1990

[54] PROCESS FOR FABRICATING A HIGH-SPEED CMOS TTL SEMICONDUCTOR DEVICE

[75] Inventors: Pil-Young Hong, Einchun; Tae-Yup Oh; Chun-Joong Kim, both of Seoul; Sang-Suk Kang, Kyoungsangbuk, all of Rep. of Korea

[73] Assignee: Samsung Electronic Co. Ltd., Suwon, Rep. of Korea

[21] Appl. No.: 292,106

[22] Filed: Dec. 30, 1988

[30] Foreign Application Priority Data

Dec. 31, 1987 [KR] Rep. of Korea ............... 1987-15551

[51] Int. Cl.$^5$ ........................... H01L 21/265
[52] U.S. Cl. ........................ 437/57; 437/56; 437/195; 357/23.11; 357/42
[58] Field of Search ............ 437/56, 57, 195; 357/23.11, 42

[56] References Cited

U.S. PATENT DOCUMENTS 4,152,823 5/1979 Hall ...................... 437/195

FOREIGN PATENT DOCUMENTS 0043842 3/1980 Japan ..................... 357/42
0065446 5/1980 Japan ..................... 437/195

OTHER PUBLICATIONS

Black et al., "CMOS Process for High-Performance Analog LSI", International Electron Devices Meeting, Dec. 6-8, 1976, pp. 331-334.
May et al., "High-Speed Static Programmable Logic Array in LOCMOS", IEEE Journal of Solid State Circuits, vol. SC-11, No. 3, 6/1976, pp. 365-368.

Primary Examiner—Brian E. Hearn
Assistant Examiner—Tuan Nguyen
Attorney, Agent, or Firm—Fleit, Jacobson, Cohn, Price, Holman & Stern

[57] ABSTRACT

A process for fabricating a high-speed CMOS TTL semiconductor device, wherein the operational speed of a semiconductor device is controlled by adjusting the capacitance of its field region. The capacitance of the field region is adjusted by the thickness thereof, which is determined by the control of diffusion heating cycles in the fabrication sequence according to the invention.

10 Claims, 4 Drawing Sheets

PROCESS FOR FABRICATING A HIGH-SPEED CMOS TTL SEMICONDUCTOR DEVICE

BACKGROUND OF THE INVENTION

The present invention concerns a process for fabricating a high-speed CMOS TTL (hereinafter refered to as "HCT") semiconductor device and in particular a process for adjusting the operational speed of the semiconductor device by capacitance in the field region thereof.

Generally, the operational speed of a semiconductor device used in a logic circuit is controlled by two factors, that are, circuit design and fabrication process therein. The control of operational speed by the fabrication process can be achieved by adjusting the parasitic capacitance resulting from the thickness of its field oxide layer. Because it becomes possible to change by adjustment of the parasitic capacitance the time constant $\tau$ of the time function which is determined by the resistance component and the parasitic capacitance, the operational speed of a semiconductor device can be to some extent controlled by adjusting the thickness of the field oxide layer in the fabrication process.

FIG. 1 illustrates a conventional CMOS inverter comprising PMOS field effect transistor (PMOS) and NMOS field effect transistor (NMOS) wherein the input data Vi are inverted to the output data Vo. Referring to FIG. 2, which is a cross-sectional view of field region a between NMOS and PMOS shaded by slant lines in FIG. 1, region 1 represents N-type semiconductor substrate, region 2 a P-type well region to form NMOS, region 3 an ohmic contact of the P-well, region 4 a N+ region of NMOS drain, region 5 a N+ stop-channel, region 6 P+ region of PMOS drain, region 7 a field oxide layer, and region 8 a metal line for connecting the drains of PMOS and NMOS, respectively. In such a CMOS construction, because the lower region of the field oxide layer 7 is formed with a high concentration P+ region and a low concentration N- region, it is difficult to adjust the capacitance of the field region. Hence, the prior art process generally requires two processing sequences, one of which is, so called, an AHCT process increasing the thickness of the field oxide layer, and the other is a HCTLS process decreasing the thickness of the field oxide layer. Consequently, it makes the fabrication complicated.

SUMMARY OF THE INVENTION

It is an object of the present invention to provide a process for fabricating a semiconductor device whereby easy control of the thickness of field oxide layer can be achieved through a unit processing sequence.

According to the present invention, there is provided a process for fabricating a semiconductor device comprising the steps of forming a second conducting type well in a predetermined region on the upper surface of a first conducting type silicon semiconductor substrate, forming successively a first oxide layer and a nitride layer on the upper surface of said substrate, forming stop-channel regions in predetermined regions of said substrate and the drain and source of first MOS transistor on the upper surface of said well, forming ohmic contact regions in the edge of said well and the drain and source of second MOS transistor between said stop-channel regions, forming an oxide layer on the whole surface of said substrate to form a gate oxide layer after removing said nitride layer and said first oxide layer of the gate regions of said first and second MOS transistors, forming contact windows for contacting the source and drain of said first and second MOS transistors, forming a pattern of first metal layer so as to form the electrodes of said first and second MOS transistors, forming a pattern of a low temperature oxide layer on said first metal layer in order to insulate it from a predetermined portion, forming a pattern of a second metal layer connected with first metal layer through said contact windows, said second metal layer being insulated from said first metal layer by said low temperature oxide layer, and forming a protection layer on said second metal layer.

DETAILED DESCRIPTION OF A PREFERRED EMBODIMENT OF THE INVENTION

Figure 1:
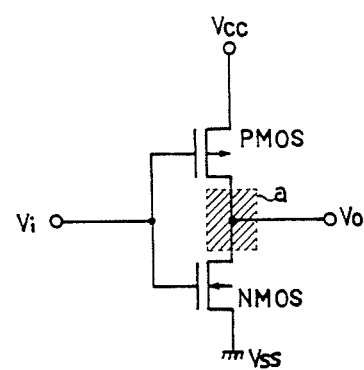
FIG. 1 is a circuit diagram of a conventional CMOS inverter.
Figure 2:
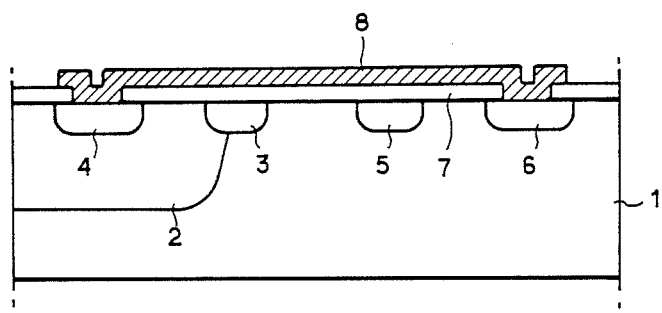
FIG. 2 is a cross-sectional view of the region of a FIG. 1.
Figure 3A:
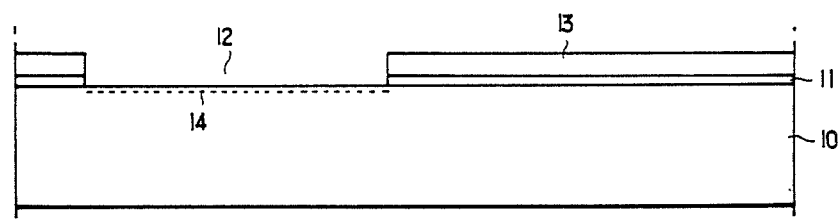
FIGS. 3A-3I illustrate the fabrication process according to the present invention, respectively.

Hereinafter, the present invention will be described in detail with reference to the drawings, by way of example only. FIGS. 3A to 3I illustrate a cross-sectional view of the fabrication process according to the present invention of a CMOS inverter. On N-silicon semiconductor substrate 10 is initially formed oxide layer 11 with the thickness of about 2000-3000 Å. In order to form a P-type well region to make a NMOS, photoresist is deposited on the whole upper surface of the substrate 10, and by conventional photolithography, photoresist mask pattern 13 is made to obtain window 12 over the underlying region to form the P-type well. After etching the portions of initial oxide layer 11 exposed through window 12 by taking photoresist mask pattern 13 as a mask, boron is ion-implanted into that portions in the dose of $2 \times 10^{13} - 3 \times 10^{13}$ ions/cm$^2$ with the energy of 40-50 KeV in order to form P-type ion-implantation region 14, as shown in FIG. 3A, so that that P-well can be formed. After removing the photoresist makes pattern, P-type ions of P-type ion-implantation region 14 are re-distributed (or diffused) to form P-well 15 by a conventional drive-in process. In this process, the junction depth of the P-well should be 5-6 $\mu$m, and on the upper surface of P-well 15 is grown an oxide layer of about 5000-5500 Å.

Figure 3B:
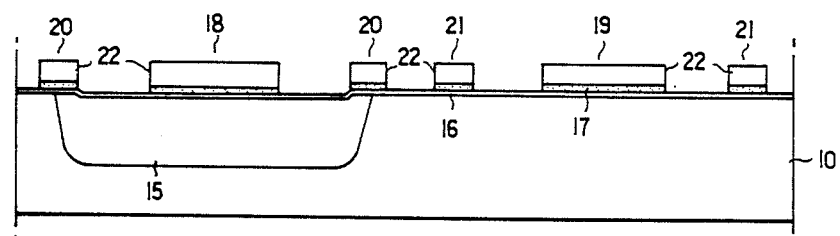

Thereafter, initial oxide layer 11 on substrate 10, and the oxide layer grown in the drive-in process not shown in the drawings are all removed. On the whole upper surface of the substrate is deposited first oxide layer 16 having the thickness of 150-200 Å, on the whole upper surface of which is deposited nitride layer 17 by a conventional CVD method. On the nitride layer 17 is deposited photoresist, and by a conventional photolithography is formed mask pattern 22 as shown in FIG. 3B, comprising P-well region 18 to form a NMOS, substrate upper region 19 to form PMOS, P+ ohmic contact region 20 in the edge of the P-well region, and the upper surface of N+ stop-channel region 21. After etching the portions of nitride layer 17 exposed through photoresist mask pattern 22, the mask pattern 22 is removed from the substrate, and by the conventional heat treatment is grown field oxide layer 23 having the thickness of about 1100 Å. In this processing step, the thickness of field oxide layer 23 can be arbitrarily adjusted by controlling the diffusion heating cycle. According to the example, although the thickness of the field oxide layer amounts to about 1100 Å to obtain a high-speed inverter, it may be reduced to 700 Å, 500 Å, 300 Å, etc. to obtain low speed. Also, the field oxide layer may not be grown.

Figure 3C:
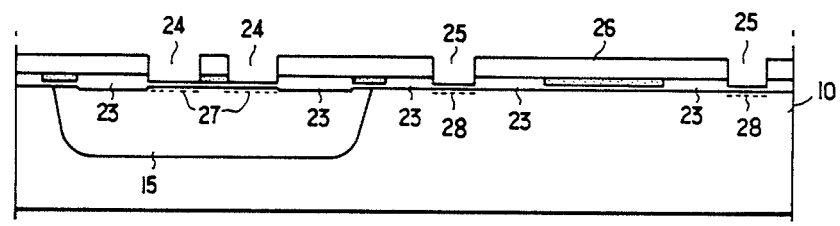

On the whole upper surface of the substrate 10 is deposited photoresist, and by the conventional photolithography is formed mask pattern 26 as shown FIG. 3C, which masks the regions except region 24 to form the drain and source of the NMOS, and stop-channel region 25. After etching the portions of nitride layer 17 exposed through the mask pattern 26, into the etched portions phosphorous is ion-implanted in the dose of $1\times10^{15}$–$3\times10^{15}$ ions/cm² with the energy of 50–60 KeV, and the arsenic is ion-implanted in the dose of $2\times10^{15}$ $4\times10^{15}$ ions/cm with the energy of 70–80 KeV, thereby forming N+ ion implant regions 27 and 28.

As described above, if phosphorous and arsenic ions are successively implanted, the junction breakdown voltage of NMOS is increased to improve the characteristic of NMOS.

After removing the mask pattern 26, N+ ion implantation regions 27 and 28 are activated by the conventional heat treatment to form the drain and source 29 of the NMOS stop-channel region 30. The junction depth of N+ region formed in this process is about 0.5 μm, and on the upper surface of N+ regions 29 and 30 is formed oxide layer 31 of 1000 Å.

Figure 3D:
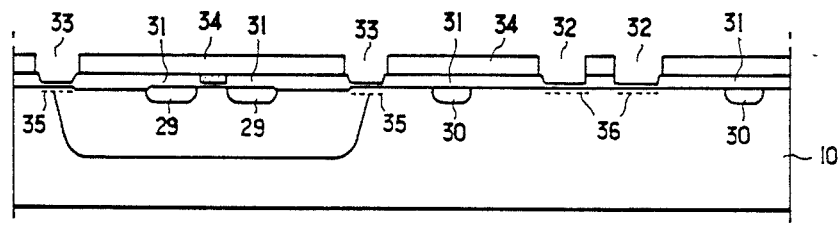

On the whole upper surface of the substrate is deposited photoresist to form mask pattern 34 by the conventional photolithography as shown in FIG. 3D, which masks the regions except the region 32 to form the drain and source of PMOS, and P+ regions 33 for the ohmic contact of the P-well. Thereafter, the portions of nitride 17 exposed through mask pattern 34 are etched. Into the portions etched is ion-implanted boron in the dose of $1\times10^{15}$–$2\times10^{15}$ ions/cm² with the energy of 30–50 KeV so as to form P+ ion implantation regions 35 and 36. After removing the mask pattern 34, P+ ion implantation regions 35 and 36 are activated to form the drain and source 37 of PMOS, and P+ region 38 for the ohmic contact of the P-well by the conventional heat treatment. The junction depth of the P+ region formed in this processing step is about 0.7 μm, and on the upper surface of P+ regions 37 and 38 is formed oxide layer 39 having the thickness of 1000 Å as the upper surface of N+ regions 29 and 30.

Figure 3E:
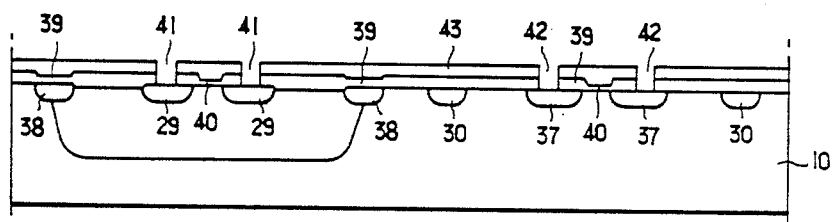

After removing the remaining nitride layer 17 and the portions of first oxide layer 16 existing in the regions to form the gates of the MOS transistors, gate oxide layer 40 is grown to have the thickness of 300–400 Å. On the whole upper surface of the substrate is deposited photoresist to form mask pattern 43 by the conventional photolithography, as shown in FIG. 3E, so that the contact regions can be formed over the drain and source regions 29 and 37 of NMOS and PMOS. Etching the portions of the gate oxide layer exposed through the mask pattern 43 provides contact windows 41 and 42 over N+ region 29 and P+ region 37. Thereafter, all of the mask pattern 43 is removed from the substrate.

Figure 3F:
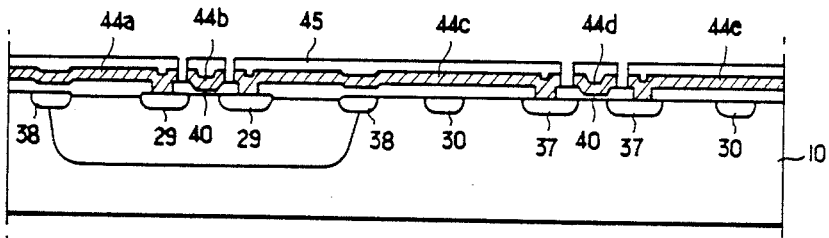

On the whole upper surface of the substrate is deposited a first metal layer by conventional metallization deposition, on which metal layer is deposited photoresist 45 to pattern the electrodes. After metal electrodes 44a, 44b, 44c, 44d, are formed as shown in FIG. 3F by the conventional lithography, the remaining photoresist mask pattern 45 is removed from the substrate. Because the semiconductor device shown in the drawings is a CMOS inverter, the electrode 44c is formed by interconnection of the drain electrode of NMOS and the electrode of PMOS.

Figure 3G:
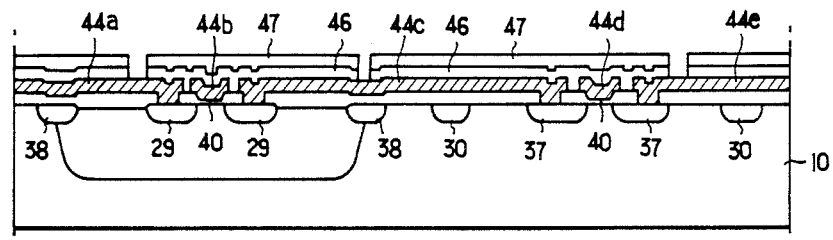
Figure 3H:
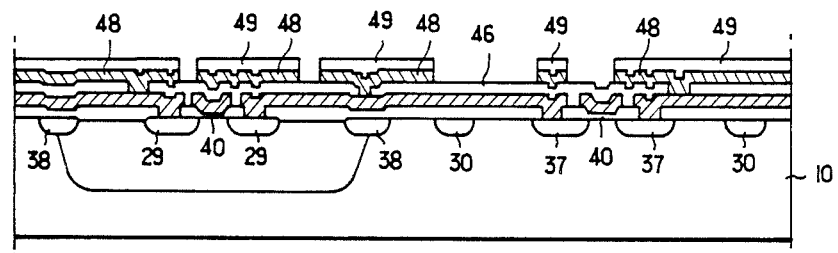
Figure 3I:
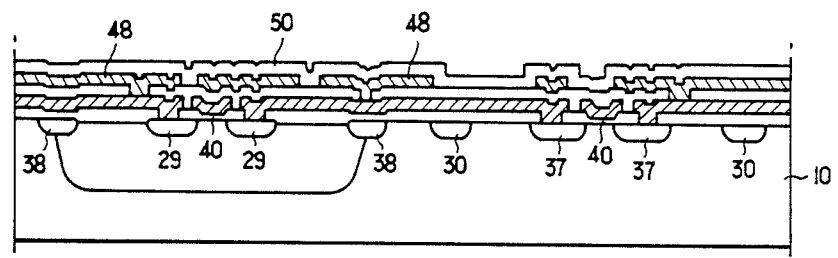

Thereafter, on the upper surface of the substrate is deposited low temperature oxide layer 46, on the whole upper surface of which is deposited photoresist 47 to connect first and second metal layers, and the pattern of low temperature oxide layer 46 is made by the conventional photolithography, as shown in FIG. 3G. Then, the mask pattern 47 is removed from the substrate. Subsequently, on the whole upper surface of the substrate is deposited second metal layer 48 to connect with first metal layer 44 by conventional metallization. Photoresist 49 is deposited on second metal layer 48, which is patterned as shown in FIG. 3H by the conventional photolithography. After the mask pattern 49 is wholly removed from the substrate, protection layer 50 is formed on the substrate, as shown in FIG. 3I, to obtain the passivation of the semiconductor device.

As described above, the present invention facilities adjusting the capacitance of the field oxide layer, and therefore converts into an unity fabrication process the conventional fabrication process using the duplicate steps. Consequently, the operational speed of a semiconductor device can readily be adjusted according to the present invention. Further, the present invention may be employed in fabricating all the semiconductor devices used for a logic circuit.

While the invention has been particularly shown and described with reference to a preferred embodiment, it will be understood by those skilled in the art that modifications in detail may be made without departing from the spirit and scope of the invention.

What is claimed is:

1. A process for fabricating a semiconductor device, comprising the steps of:

forming a second conductivity type well region over a first conductivity type silicon semiconductor substrate;

forming successively a first oxide layer and a nitride layer over said substrate;

selectively removing portions of said nitride layer over a first MOS transistor region on said well region, a second transistor region on said substrate, and channel-stop regions around said second transistor region;

forming a field oxide layer in the first MOS transistor, second transistor and channel-stop regions exposed by said step of selectively removing portions of said nitride layer, forming drain and source of said first MOS transistor over said well region, and stop-channel regions in said substrate;

forming ohmic contact regions in an edge of said well region, and drain and source of said second MOS transistor between said stop-channel regions over said substrate;

forming a second oxide layer on the whole surface of said substrate to form a gate oxide layer after removing said nitride layer and said first oxide layer of the gate regions of said first and second MOS transistors;

forming contact windows for contacting the source and drain of said first and second MOS transistors;

forming a pattern of a first metal layer to form electrodes of said first and second MOS transistors;

forming a pattern of low temperature oxide layer over said first metal layer to insulate a specified portion;

forming a pattern of a second metal layer connected with first metal layer through said contact windows, being insulated from said first metal layer by said low temperature oxide layer; and forming a protection layer over said second metal layer.

2. A process as claimed in claim 1, further comprising the steps for concurrently removing the nitride layers over the edge region of said second conductivity type well region, a region to form said first MOS transistor on said well region, a region to form said second transistor on said substrate, and the stop-channel region to be formed around said second MOS transistor region, after said step of forming successively the first oxide layer and the nitride layer over said substrate, and then forming said field oxide layer in the regions exposed by removing the nitride layers said nitride layer by a heat treatment process.

3. A process as claimed in claim 2, further comprised of forming said second conductivity type well by implanting second conductivity type ions in a dose of $2\times10^{15}$–$3\times10^{15}$ ions/cm$^2$ with an energy of 40–50 KeV, and thereon heat-treating for the junction depth to reach 5–6 $\mu$m.

4. A process as claimed in claim 2, wherein the drain and source of said first MOS transistor, and said stop-channel region are formed by ion-implanting phosphorus and arsenic ions, and thereupon heat-treating for a predetermined junction depth.

5. A process as claimed in claim 2, wherein the drain and source of said second MOS transistor, and said ohmic contact region of said well edge are formed by implanting first conductivity N-type ions, and heat-treating for the junction depth to be deeper of the drain and source of said first MOS transistor.

6. A process for fabricating a semiconductor device, comprising the steps of:

forming a second conductivity type well region over a first conductivity type silicon semiconductor substrate;

forming successively a first oxide layer and a nitride layer over said substrate;

selectively removing portions of said nitride layer over a first MOS transistor region on said well region, a second transistor region on said substrate, and channel-stop regions around said second transistor region;

forming a field oxide layer in the first MOS transistor, second transistor and channel-stop regions exposed by said step of selectively removing portions of said nitride layer, forming a drain and a source of a first MOS transistor over said well region, and stop-channel regions in said substrate;

forming ohmic contact regions in an edge of said well region, and drain and a source of second MOS transistor between said stop-channel regions over said substrate;

forming a second oxide layer on the surface of said substrate to form a gate oxide layer after removing said nitride layer and said first oxide layer of the gate regions of said first and second MOS transistors;

forming contact windows to the source and drain of said first and second MOS transistors;

forming a pattern of a first metal layer to form electrodes of said first and second MOS transistors; and forming a pattern of low temperature oxide layer over said first metal layer.

7. A process as claimed in claim 6, further comprising the steps for concurrently removing the nitride layer over the edge region of said second conductivity type well region, a region to form said first MOS transistor on said well region, a region to form said second transistor on said substrate, and the stop-channel region to be formed around said second MOS transistor region, after said step of forming successively the first oxide and the nitride layer over said substrate, and then forming said field oxide layer layer in the regions exposed by removing the nitride layers said nitride layer.

8. A process as claimed in claim 7, further comprised of forming said second conductivity type well by implanting second conductivity type ions in a dose of $2\times10^{15}$–$3\times10^{15}$ ions/cm$^2$ with an energy of 40–50 KeV, and thereon heat-treating for the junction depth to reach 5–6 $\mu$m.

9. A process as claimed in claim 7, wherein the drain and source of said first MOS transistor, and said stop-channel region are formed by ion-implanting phosphorus and arsenic ions, which is thereupon heat-treating for a predetermined junction depth.

10. A process as claimed in claim 7, wherein the drain and source of said second MOS transistor, and said ohmic contact region of said well edge are formed by implanting first conductivity N-type ions, and heat-treating for the junction depth to be more than that of the drain and source of said first MOS transistor.

* * * * *

UNITED STATES PATENT AND TRADEMARK OFFICE
CERTIFICATE OF CORRECTION

PATENT NO. : 4,920,066                                   Page 1 of 2

DATED : 24 April 1990

INVENTOR(S) : Pil-Young HONG et al.

It is certified that error appears in the above-identified patent and that said Letters Patent is hereby corrected as shown below:

Claim 1, Column 4, Line 63, delete "the";

Claim 2, Column 5, Line 11, replace "layers" with --layer--;

Line 20, delete "layers said nitride";

Claim 5, Column 5, Line 37, insert --than the depth-- after "deeper";

Claim 6, Column 5, Line 49, insert --MOS-- after "second";

Column 6, Line 2, insert --MOS-- after "second";

Line 9, insert --a-- before "drain", and insert --said-- after "of";

Claim 7, Column 6, Line 27, insert --MOS-- after "second";

Line 32, delete "layer" (second occurrence);

Line 33, delete "layers said nitride";

UNITED STATES PATENT AND TRADEMARK OFFICE
CERTIFICATE OF CORRECTION

PATENT NO. : 4,920,066

DATED : April 24, 1990

INVENTOR(S) : Pil-Young Hong et al

It is certified that error appears in the above-identified patent and that said Letters Patent is hereby corrected as shown below:

Claim 8, Column 6, Line 39, replace "5-6µm" with --5µm-6µm--;

Claim 10, Column 6, Line 46, replace the comma with --region--;
Line 47, insert a comma after "edge".

Signed and Sealed this

Thirtieth Day of March, 1993

*Attest:*

STEPHEN G. KUNIN

*Attesting Officer*  Acting Commissioner of Patents and Trademarks